(12) United States Patent
Shoji et al.

(10) Patent No.: US 6,614,304 B2
(45) Date of Patent: Sep. 2, 2003

(54) VARIABLE GAIN CIRCUIT HAVING EXTERNAL CONTROLS AND A LOW SUPPLY VOLTAGE

(75) Inventors: Norio Shoji, Kanagawa (JP); Tatsuya Shirakawa, Tokyo (JP)

(73) Assignee: Sony Corporation, Tokyo (JP)

(*) Notice: Subject to any disclaimer, the term of this patent is extended or adjusted under 35 U.S.C. 154(b) by 0 days.

(21) Appl. No.: 10/035,241

(22) Filed: Jan. 4, 2002

(65) Prior Publication Data

US 2002/0130718 A1 Sep. 19, 2002

(30) Foreign Application Priority Data

Jan. 10, 2001 (JP) ................................... P2001-002273

(51) Int. Cl.[7] ................................................. H03F 3/45
(52) U.S. Cl. ........................................................ 330/254
(58) Field of Search ................................ 330/254, 261; 327/359

(56) References Cited

U.S. PATENT DOCUMENTS 5,986,501 A * 11/1999 Rafati et al. ................. 330/254
2001/0050586 A1 * 12/2001 Pisati et al. .................. 327/359

* cited by examiner

*Primary Examiner*—Steven J. Mottola
(74) *Attorney, Agent, or Firm*—Rader, Fishman & Grauer PLLC; Ronald P. Kananen

(57) ABSTRACT

The present invention relates to a variable gain circuit including: a first transistor and a second transistor each having a control electrode connected to a circuit input terminal; a load connected between a first power supply and a first electrode of at least one of the first transistor and the second transistor; a third transistor and a fourth transistor having second electrodes connected to the first transistor and the second transistor, respectively, and each having a first electrode and a control electrode connected to each other; a first variable current source connected between a second power supply and the second electrodes of the first transistor and the third transistor and having a current value variable according to an external control signal; a second variable current source connected between the second power supply and the second electrodes of the second transistor and the fourth transistor and having a current value variable according to the control signal; a current source connected between the first power supply and a node of the first electrodes and the control electrodes of the third transistor and the fourth transistor; and an impedance component having one end connected to the first electrodes and the control electrodes of the third transistor and the fourth transistor.

6 Claims, 2 Drawing Sheets

VARIABLE GAIN CIRCUIT HAVING EXTERNAL CONTROLS AND A LOW SUPPLY VOLTAGE

BACKGROUND OF THE INVENTION

The present invention relates to a variable gain circuit whose gain is externally controllable, and particularly, to a variable gain circuit operable at a low supply voltage.

A configuration using a Gilbert multiplier is common as a variable gain circuit. An example of a variable gain circuit according to a related art is shown in FIG. 3. In FIG. 3, the related-art, variable gain circuit has a differential amplifier circuit 101, two current divider circuits 102 and 103, a control voltage (Vc) generating source 104, and a bias voltage (Vb) generating source 105.

The differential amplifier circuit 101 is formed by: NPN-type differential pair transistors Q101 and Q102; an emitter resistance R101 connected between emitter electrodes of the differential pair transistors Q101 and Q102; and constant current sources I101 and I102 connected between a ground and the emitter electrodes of the differential pair transistors Q101 and Q102, respectively. Base electrodes of the differential pair transistors Q101 and Q102 are connected to circuit input terminals 106 and 107, respectively.

One current divider circuit 102 has a differential circuit configuration formed by NPN-type differential pair transistors Q103 and Q104, each having an emitter electrode commonly connected to a collector electrode of the transistor Q101, and a resistance R102 connected between a collector electrode of one transistor Q103 and a power supply Vcc. A collector electrode of the other transistor Q104 is connected directly to the power supply Vcc.

The other current divider circuit 103 has a differential circuit configuration formed by NPN-type differential pair transistors Q105 and Q106, each having an emitter electrode commonly connected to a collector electrode of the transistor Q102, and a resistance R103 connected between a collector electrode of one transistor Q105 and the power supply Vcc. A collector electrode of the other transistor Q106 is connected directly to the power supply Vcc.

The collector electrodes of the transistors Q103 and Q105 in the current divider circuits 102 and 103 are connected to circuit output terminals 108 and 109, respectively. Base electrodes of the transistors Q104 and Q106 are commonly connected to a positive electrode side of the control voltage generating source 104, whereas base electrodes of the transistors Q103 and Q105 are commonly connected to a negative electrode side of the control voltage generating source 104. A positive electrode side of the bias voltage generating source 105 is connected to the base electrodes of the transistors Q103 and Q105, while a negative electrode side of the bias voltage generating source 105 is connected to the ground.

In the thus formed variable gain circuit, letting Ic1 and Ic2 be collector currents of the transistors Q103 and Q104 and Vc be a control voltage of the control voltage generating source 104, $$Ic2/Ic1 = \exp(Vc/Vt) \qquad (1)$$

where Vt=kT/q, k being the Boltzmann constant, T being the absolute temperature, and q being the amount of electron charge.

Letting IA be a current value of the constant current source I101, since Ic1+Ic2=IA, $$Ic1/IA = Ic1/(Ic1 + Ic2) \qquad (2)$$
$$= 1/\{1 + (Ic2/Ic1)\}$$

Hence, when substituting the equation (1) into the equation (2), $$Ic1/IA = 1/\{1 + (\exp(Vc/Vt))\} \qquad (3)$$

Letting vi be an input voltage, vo be an output voltage, RA be a resistance value of the resistance R101, and RB be resistance values of the resistances R102 and R103, a gain Av of the variable gain circuit according to the related art is given by:

$$Av = \frac{vo}{vi} = 2\frac{RB}{RA} \cdot \frac{1}{1 + \exp\frac{Vc}{Vt}} \qquad (4)$$

As is clear from the equation (4), the gain Av can be varied by the control voltage Vc of the control voltage generating source 104.

However, the thus formed variable gain circuit according to the related art has a circuit configuration with the differential circuits piled in two stages in the direction of the supply voltage. Therefore, supposing that the base-to-emitter voltage of the bipolar transistors is about 0.9 V at a maximum, and supposing that when the constant current source I101 is formed by a bipolar transistor, the collector-to-emitter voltage of the transistor is about 0.4 V, a voltage of about 2.2 V is required for operation of the differential circuits piled in two stages (differential amplifier circuit 101 and current divider circuit 102) and the constant current source I101.

Furthermore, when device variations and the like are taken into consideration, a supply voltage of at least about 2.5 V is required to prevent saturation of the differential circuits and the constant current source I101. In general, when the dynamic range and transient characteristics are taken into consideration, the related-art, variable gain circuit formed as described above is of a circuit type operated under a supply voltage of about 3.3 V. Thus, while there has recently been a tendency toward lower supply voltage in portable terminals, such as portable telephones and PDAs (Personal Digital Assistants), the related-art, variable gain circuit formed as described above cannot meet the need for lower supply voltage.

SUMMARY OF THE INVENTION

The present invention has been made in view of the above problem, and it is accordingly an object of the present invention to provide a variable gain circuit operable at a lower supply voltage.

According to an aspect of the present invention, there is provided a variable gain circuit including: a first transistor and a second transistor, each having a control electrode connected to a circuit input terminal; a load connected between a first power supply and a first electrode of at least one of the first transistor and the second transistor; a third transistor and a fourth transistor having second electrodes connected to the first transistor and the second transistor, respectively, and each having a first electrode and a control electrode connected to each other; a first variable current source connected between a second power supply and the second electrodes of the first transistor and the third transistor and having a current value variable according to an external control signal; a second variable current source connected between the second power supply and the second electrodes of the second transistor and the fourth transistor and having a current value variable according to the control signal; a current source connected between the first power supply and a node of the first electrodes and the control electrodes of the third transistor and the fourth transistor;

and an impedance component having one end connected to the first electrodes and the control electrodes of the third transistor and the fourth transistor.

Both bipolar transistors and field-effect transistors can be used as the first to fourth transistors. In the case of using a bipolar transistor, the first electrode refers to a collector electrode reached by a carrier (electron or hole), the second electrode refers to an emitter electrode for injecting the carrier, and the control electrode refers to a base electrode supplied with a current for controlling movement of the carrier injected from the emitter electrode. On the other hand, in the case of using a field-effect transistor, the first electrode refers to a drain electrode reached by a carrier, the second electrode refers to a source electrode for supplying the carrier, and the control electrode refers to a gate electrode supplied with a signal for controlling the main current.

DETAILED DESCRIPTION OF THE PREFERRED EMBODIMENT

Figure 1:
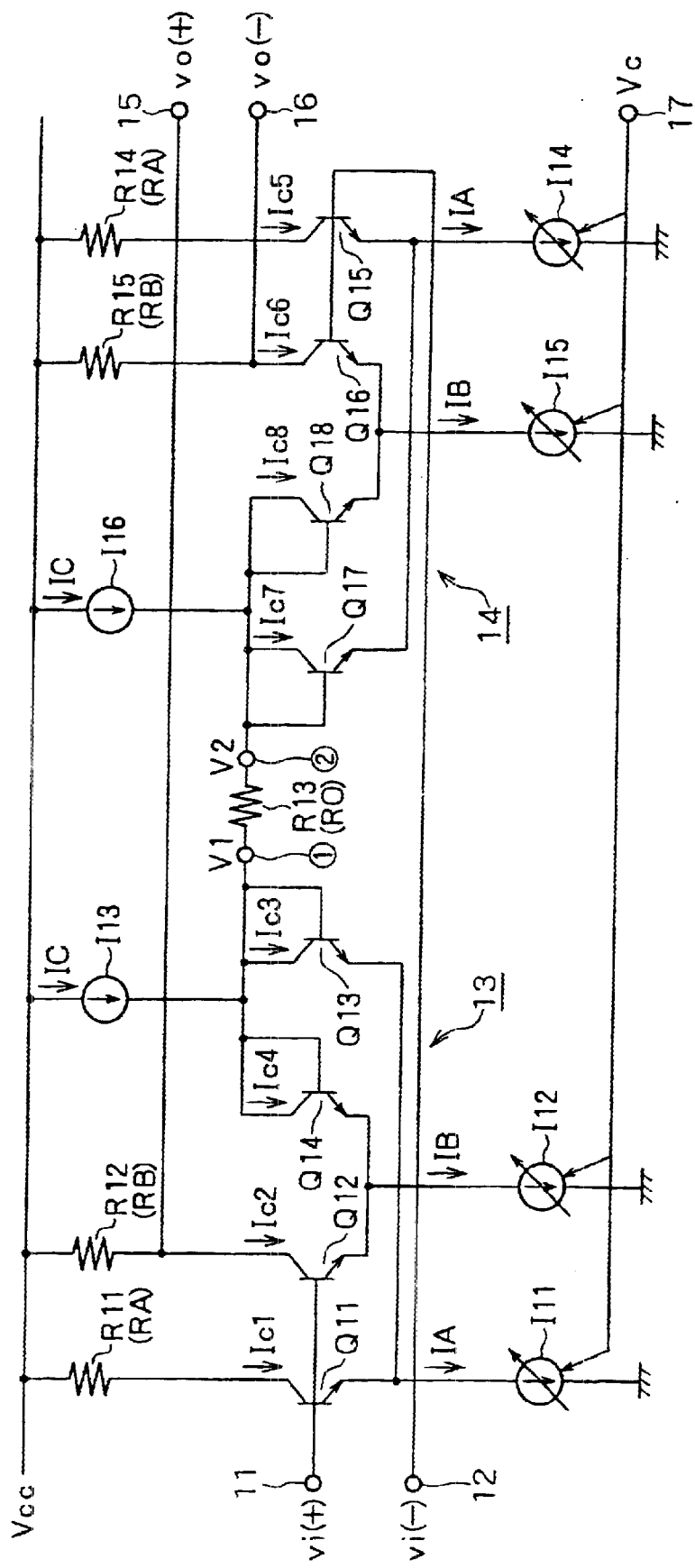
FIG. 1 is a circuit diagram showing a circuit configuration of a variable gain circuit according to an embodiment of the present invention.

A preferred embodiment of the present invention will hereinafter be described in detail with reference to the drawings. FIG. 1 is a circuit diagram showing a circuit configuration of a variable gain circuit according to an embodiment of the present invention. The description in the following will be made by taking as an example a case where bipolar transistors are used as transistors forming the circuit.

In FIG. 1, base electrodes of NPN-type transistors Q11 and Q12 are connected to a circuit input terminal 11, which is supplied with an input signal vi(+) of positive polarity. Resistances R11 and R12 are connected between a first power supply, for example, a positive power supply Vcc, and collector electrodes of the transistors Q11 and Q12, respectively. An emitter electrode of an NPN-type transistor Q13 is connected to an emitter electrode of the transistor Q11. Similarly, an emitter electrode of an NPN-type transistor Q14 is connected to an emitter electrode of the transistor Q12. The above components form a first current divider circuit 13.

In the first current divider circuit 13, a variable current source I11 whose current value is variable is connected between a second power supply, for example, a ground, and a common emitter connection point of the transistors Q11 and Q13. Similarly, a variable current source I12 is connected between the ground and a common emitter connection point of the transistors Q12 and Q14. The transistors Q13 and Q14 are each of a diode-connected configuration in which a collector electrode and a base electrode are connected to each other.

The collector electrode and the base electrode of the transistor Q13 are further connected to the collector electrode and the base electrode of the transistor Q14. A current source I13 is connected between the power supply Vcc and a common connection point of the collectors and the bases of the transistors Q13 and Q14. Also, one end of an impedance component, for example, a resistance R13, is connected to the common connection point of the collectors and the bases of the transistors Q13 and Q14.

On the other hand, base electrodes of NPN-type transistors Q15 and Q16 are connected to a circuit input terminal 12, which is supplied with an input signal vi(−) of a polarity opposite from that of the input signal vi(+). Resistances R14 and R15 are connected between the power supply Vcc and collector electrodes of the transistors Q15 and Q16, respectively. An emitter electrode of an NPN-type transistor Q17 is connected to an emitter electrode of the transistor Q15. Similarly, an emitter electrode of an NPN-type transistor Q18 is connected to an emitter electrode of the transistor Q16. The above components form a second current divider circuit 14.

In the second current divider circuit 14, a variable current source I14 is connected between the ground and a common emitter connection point of the transistors Q15 and Q17. Similarly, a variable current source I15 is connected between the ground and a common emitter connection point of the transistors Q16 and Q18. The transistors Q17 and Q18 are each of the diode-connected configuration in which a collector electrode and a base electrode are connected to each other.

The collector electrode and the base electrode of the transistor Q17 are further connected to the collector electrode and the base electrode of the transistor Q18. A current source I16 is connected between the power supply Vcc and a common connection point of the collectors and the bases of the transistors Q17 and Q18. Also, the other end of the resistance R13 is connected to the common connection point of the collectors and the bases of the transistors Q17 and Q18.

The collector electrode of the transistor Q12 in the thus formed variable gain circuit according to the present embodiment is connected to a circuit output terminal 15, whereby an output signal vo(+) of positive polarity is derived from the circuit output terminal 15. In addition, the collector electrode of the transistor Q16 is connected to a circuit output terminal 16, whereby an output signal vo(−) of the opposite polarity is derived from the circuit output terminal 16. In this configuration example, it is possible to omit the resistances R11 and R14, where no output signals are derived. Current values of the variable current sources I11, I12, I14, and I15 can be varied according to a control voltage Vc supplied externally via a control terminal 17.

Operating principles of the thus formed variable gain circuit according to the present embodiment will next be described.

First, let Ic1 to Ic8 be collector currents flowing through the transistors Q11 to Q18, respectively. Suppose that the current values of the variable current sources I11 and I14 are equal to each other, and let IA be the current value; suppose that the current values of the variable current sources I12 and I15 are equal to each other, and let IB be the current value; and suppose that current values of the current sources I13 and I16 are equal to each other, and let IC be the current value. Further, suppose that resistance values of the resistances R11 and R14 are equal to each other, and let RA be the resistance value; and suppose that resistance values of the resistances R12 and R15 are equal to each other, and let RB be the resistance value.

First, letting V1 be a voltage of the one end of the resistance R13, that is, a node ①, $$vi(+) - Vt\ln(Ic1/Is) + Vt\ln(Ic3/Is) = V1$$

$$vi(+) - Vt\ln(Ic2/Is) + Vt\ln(Ic4/Is) = V1$$

where Vt=kT/q, k is the Boltzmann constant, T is the absolute temperature, q is the amount of electron charge, and the current Is is a constant determined by transistor fabrication process. From the above equations, the following equation is obtained:

$$vi(+)-V1=Vt\ln(Ic1/Ic3)=Vt\ln(Ic2/Ic4)$$

Thus, the following relation holds:

$$Ic1/Ic3=Ic2/Ic4 \quad (5)$$

Also, $$Ic1+Ic3=IA \quad (6)$$

$$Ic2+Ic4=IB \quad (7)$$

Hence, supposing that IC=(IA+IB)/2, $$Ic1=Ic3=IA/2, \; Ic2=Ic4=IB/2$$

Letting re1 to re4 be emitter resistances of the transistors Q11 to Q14, an impedance Z when the circuit input terminal 11 side is viewed from the node ① is:

$$Z=(re1+re3)//(re2+re4)$$

Since re1=Vt/Ic1, . . . , re4=Vt/Ic4, the impedance Z is expressed as:

$$Z=4Vt/(IA+IB)$$

Hence, letting RO be the resistance value of the resistance R13, the gain Av of the variable gain circuit according to the present embodiment is:

$$Av = \frac{IB}{IA+IB} \cdot \frac{2RB}{\frac{8Vt}{IA+IB}+RO} \quad (8)$$

Thus, as is clear from equation (8), the gain Av of the variable gain circuit according to the present embodiment is changed by controlling the current value IA of the variable current sources I11 and I14 and the current value IB of the variable current sources I12 and I15 by means of the control voltage Vc supplied externally via the control terminal 17.

While circuit operation on the part of the first current divider circuit 13 has been described above, exactly the same operation is performed on the part of the second current divider circuit 14.

As described above, the variable gain circuit according to the present embodiment has a circuit configuration in which each current divider circuit 13 (transistors Q11 to Q14) and current divider circuit 14 (transistors Q15 to Q18) is arranged in only one stage in the direction of the supply voltage. Therefore, a voltage of about 0.9 V is required at a maximum to drive the bipolar transistors, and supposing that when the current sources I11 to I16 are formed by bipolar transistors, the collector-to-emitter voltage of the transistors is about 0.4 V, a voltage of about 1.7 V (=0.9+0.4×2) is required to drive the variable gain circuit.

Figure 3:
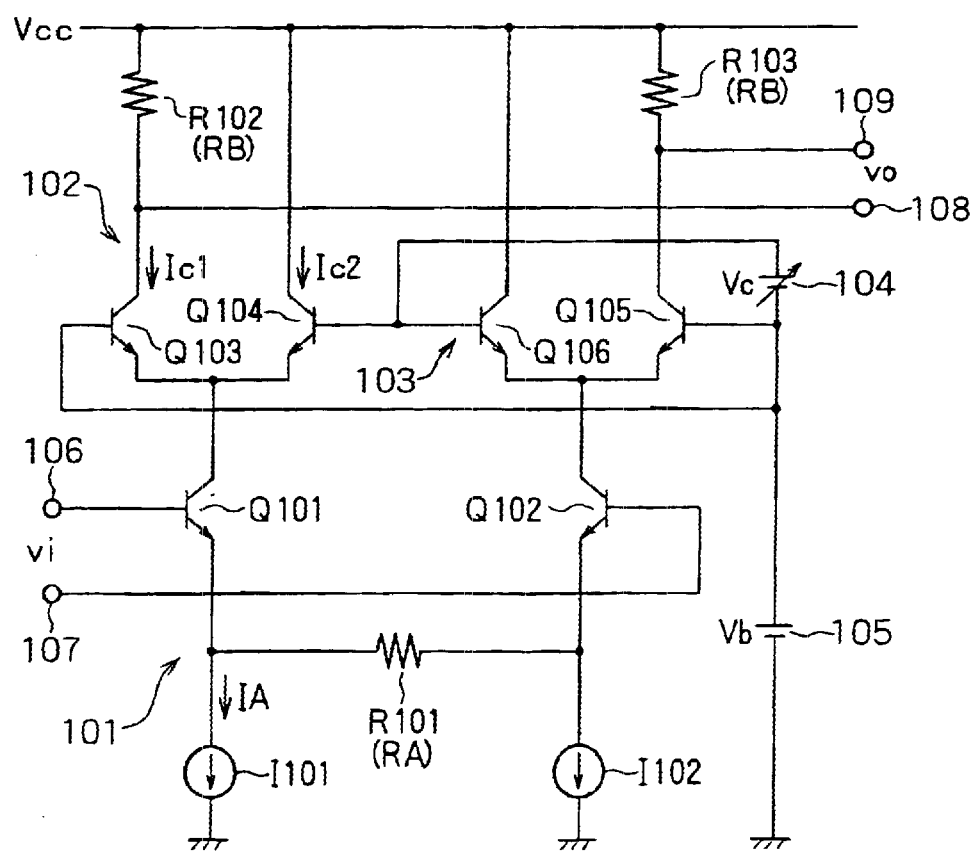
FIG. 3 is a circuit diagram showing a circuit configuration of a variable gain circuit according to a related art.

The variable gain circuit according to the present embodiment will be compared with the variable gain circuit according to the related art shown in FIG. 3. As described above, the variable gain circuit according to the related art has a configuration with the two differential circuits piled in the direction of the supply voltage and, therefore, requires a voltage of about 2.2 V (=0.9×2+0.4) for circuit operation. On the other hand, the variable gain circuit according to the present embodiment has the above-described circuit configuration and, therefore, requires a voltage of only about 1.7 V. It is thus possible to reduce the supply voltage required for circuit operation by about 0.5 V as compared with the related art.

Thus, since the supply voltage can be reduced, it is possible to deal adequately with the further reduction of the supply voltage in portable terminals, such as portable telephones and PDAs. Accordingly, the variable gain circuit according to the present embodiment is suitable for use as a gain-controlled amplifier in a circuit unit of a portable terminal or the like. In addition, since the current divider circuits 13 and 14 (transistors Q11 to Q14, and transistors Q15 to Q18, respectively) are formed by using bipolar transistors, the circuits can operate at high speed.

It is to be noted that the present embodiment has been described by taking as an example a case where NPN-type bipolar transistors are used as transistors forming the circuit; however, PNP-type bipolar transistors can be used by changing the polarity of the power supply. The circuit also can be formed by using field-effect transistors, for example, MOS transistors. When using MOS transistors, because the voltage for operating a MOS transistor is generally lower than that for a bipolar transistor, the supply voltage can be further reduced by also forming the current sources I11 to I16 using MOS transistors.

As is clear from equation (4), the gain Av of the variable gain circuit according to the related art cannot be set to zero, whereas as is clear from the equation (8), the gain Av of the variable gain circuit according to the present embodiment can be set to zero. The following example of the use of the variable gain circuit is conceivable as a case where the gain Av of the variable gain circuit is set to zero.

Figure 2:
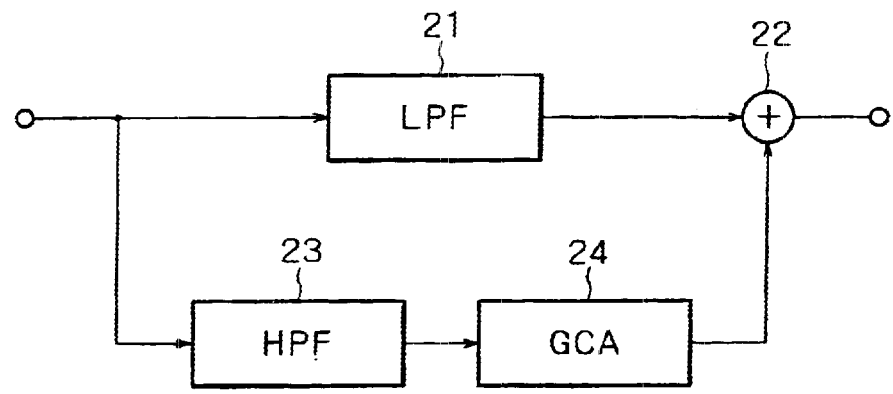
FIG. 2 is a block diagram showing an example of the use of the variable gain circuit according to the present embodiment.

FIG. 2 shows a circuit where an input signal is passed through an LPF (low-pass filter) 21 and then supplied to an adder 22 as one input thereof and is passed through an HPF (high-pass filter) 23 and a GCA (gain-controlled amplifier) 24 and then supplied to the adder 22 as the other input thereof; and, the addition output of the adder 22 is derived as an output signal. In the thus formed circuit, the variable gain circuit according to the foregoing embodiment is used as the GCA 24.

This circuit example can adjust the level of the signal passed through the HPF 23, which is to be added to the signal passed through the LPF 21, by controlling the gain of the GCA 24 by means of a control voltage Vc and also render to zero the signal component to be added to the signal passed through the LPF 21 by setting the gain of the GCA 24 to zero. It is thereby possible to conduct a circuit test based on the output signal of the adder 22, that is, a characteristic test on the LPF 21.

It is to be noted that the foregoing embodiment has been described by taking as an example a variable gain circuit set to perform differential operation by using the input signals vi(+) and vi(−) of polarities opposite from each other; however, the present invention is not limited to the circuit configuration of differential operation, and it is similarly applicable to a circuit configuration of single operation.

In addition, the foregoing embodiment has been described by taking as an example the case where the resistive element (resistance R13) is used as the impedance component; however, the present invention is not limited to a resistive element, and a capacitive element and a coil element also may be used. When a resistive element is used as the impedance component, the circuit functions as a gain-controlled amplifier, as described above; when a capacitive element is used, the circuit functions as a differentiator; and, when a coil element is used, the circuit functions as an integrator. In any of the above cases, the gain remains variable.

As described above, the variable gain circuit according to the present invention has a circuit configuration in which the current divider circuits are arranged in only one stage in the direction of the supply voltage. Therefore, it is possible to reduce the minimum voltage required for circuit operation by about 0.5 V as compared with the related-art circuit and, thus, to reduce the supply voltage.

What is claimed is:

1. A variable gain circuit comprising:

a first transistor and a second transistor each having a control electrode connected to a first circuit input terminal;

a load connected between a first power supply and a first electrode of at least one of said first transistor and said second transistor;

a third transistor and a fourth transistor having second electrodes connected to said first transistor and said second transistor, respectively, and each having a first electrode and a control electrode connected to each other;

a first variable current source connected between a second power supply and the second electrodes of said first transistor and said third transistor and having a current value variable according to an external control signal;

a second variable current source connected between the second power supply and the second electrodes of said second transistor and said fourth transistor and having a current value variable according to said control signal;

a current source connected between the first power supply and a node of the first electrodes and the control electrodes of said third transistor and said fourth transistor; and an impedance component having one end connected to the first electrodes and the control electrodes of said third transistor and said fourth transistor.

2. A variable gain circuit as claimed in claim 1, wherein said variable gain circuit further includes a second circuit input terminal supplied with an input signal of a polarity opposite from that of an input signal supplied to said first circuit input terminal, and components corresponding to said first transistor, said second transistor, said third transistor, and said fourth transistor, said load, said first variable current source, said second variable current source, and said current source, respectively, are provided between said second circuit input terminal and the other end of said impedance component.

3. A variable gain circuit as claimed in claim 1, wherein said impedance component is a resistive element, a capacitive element, or a coil element.

4. A variable gain circuit as claimed in claim 1, wherein said first transistor, said second transistor, said third transistor, and said fourth transistor are bipolar transistors.

5. A variable gain circuit as claimed in claim 1, wherein said first transistor, said second transistor, said third transistor, and said fourth transistor are field-effect transistors.

6. A variable gain circuit as claimed in claim 1, wherein only said transistors formed in one stage are present between said first power supply and said second power supply.

* * * * *